(12) United States Patent
Kang

(10) Patent No.: US 7,306,958 B2
(45) Date of Patent: Dec. 11, 2007

(54) COMPOSITE PATTERN FOR MONITORING VARIOUS DEFECTS OF SEMICONDUCTOR DEVICE

(75) Inventor: Jung Ho Kang, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/324,168

(22) Filed: Dec. 29, 2005

(65) Prior Publication Data

US 2006/0145152 A1   Jul. 6, 2006

(30) Foreign Application Priority Data

Dec. 31, 2004   (KR) ...................... 10-2004-0117830

(51) Int. Cl.
*G01R 31/26* (2006.01)
(52) U.S. Cl. .............................. 438/14; 438/17; 438/18
(58) Field of Classification Search ................ 257/758; 438/14, 17, 18
See application file for complete search history.

(56) References Cited

U.S. PATENT DOCUMENTS

| | | | | |
|---|---|---|---|---|
| 5,614,750 A | * | 3/1997 | Ellul et al. .................. | 257/386 |
| 6,452,252 B1 | * | 9/2002 | Nagatomo ................... | 257/620 |
| 6,906,363 B2 | * | 6/2005 | Suzuki ........................ | 257/273 |
| 6,908,857 B2 | * | 6/2005 | Akamatsu et al. .......... | 438/688 |
| 7,074,711 B2 | * | 7/2006 | Lee ............................. | 438/630 |

OTHER PUBLICATIONS

Yoo, Hung Ryul et al.; Field Translator Monitoring Pattern for Shallow Trench Isolation Defects In Semiconductor Device; U.S. Appl. No. 11/293,660, filed Dec. 2, 2005.

* cited by examiner

*Primary Examiner*—Wai-Sing Louie
(74) *Attorney, Agent, or Firm*—Andrew D. Fortney

(57) ABSTRACT

A composite monitor is capable of determining a variety of defects of a semiconductor device. The composite monitor has an isolation region in a well region, an active region pattern in the well region and defined by the isolation region, and a metal line pattern partially overlying the active region pattern. The composite monitor further has an optional well region pad electrically coupled to the well region and separated from the metal line pattern, an active region pad electrically coupled to the active region pattern and separated from both the metal line pattern and the well region pad, a metal line pad electrically coupled to the metal line pattern and separated from both the well region pad and the active region pad, and a first contact between the active region pattern and the metal line pattern to provide an electrical path therebetween.

19 Claims, 4 Drawing Sheets

SECTION III-III

COMPOSITE PATTERN FOR MONITORING VARIOUS DEFECTS OF SEMICONDUCTOR DEVICE

CROSS REFERENCE TO RELATED APPLICATIONS

This U.S. non-provisional application claims priority under 35 U.S.C. §119 from Korean Patent Application No. 2004-117830, which was filed in the Korean Intellectual Property Office on Dec. 31, 2004, the contents of which are incorporated by reference herein in its entirety.

BACKGROUND OF THE INVENTION

1. Field of the Invention

The present invention relates generally to a monitoring pattern for a semiconductor device and, more particularly, to a composite pattern available to monitor a variety of defects in a semiconductor device.

2. Description of the Related Art

Semiconductor integrated circuit devices are fabricated through a great number of process steps. However, to determine the yield and/or effectiveness of certain processing steps, it is beneficial to monitor unfavorable defects that often occur in such processing. A specific monitoring pattern is widely used in the art to ascertain whether a given fabrication process (or series of process steps) is performed as expected or not, and to analyze defect problems that may occur in each such fabrication process (or series of process steps).

To identify and/or ascertain whether any individual defect of a variety of defects may be present or may have occurred, many monitoring patterns should be present or involved in the semiconductor device. This may be, however, restricted by the area of the device, or otherwise, an increase in the area of the device may be caused since such conventional monitoring patterns are generally separately formed and independently used for each defect. Furthermore, where there is no monitoring pattern, some defects may not be found while or directly after a corresponding process is completed. In addition, a certain defect related with some problems may not allow an effective analysis of problems.

FIG. 1 shows, in a cross-sectional view, one example of a defect that may occur in a particular fabrication process of a semiconductor device. Referring to FIG. 1, an active region 11 surrounded by an isolation region 12 is connected to an overlying metal line 13 through a contact 14.

As semiconductor devices advance in integration, the active region 11 becomes smaller and narrower. This may invite or result in a reduction in the margin for a process for forming the contact 14, and may often cause or result in the contact 14 being placed in a wrong location, e.g., toward the isolation region 12. So, as shown in FIG. 1, since the isolation region 12 may be formed from a material similar or identical to the dielectric material 17 in which the contact 14 is formed, the contact 14 may extend downward at one bottom edge to a well region 15. Unfortunately, this extended edge of the contact 14 will act as a current leakage path 16 between the metal line 13 and the well region 15.

Such metal-to-well leakage and abnormal contact formation may not be detected until after all subsequent processes are completed. Unfortunately, this may cause considerable loss of productivity. In addition, even though any metal-to-well leakage defect can be found after fabrication, it is difficult to analyze a cause of the leakage defect using conventional monitoring patterns. So, a need is felt in the art for a monitoring pattern available for monitoring and analyzing such defects.

SUMMARY OF THE INVENTION

Exemplary, non-limiting embodiments of the present invention provide a composite monitoring pattern, which comprises a well region, an isolation region selectively formed in the well region, an active region pattern in the well region and defined by the isolation region, and a metal line pattern over the well region and partially overlying the active region pattern. The composite monitoring pattern further comprises a well region pad electrically coupled to the well region and (electrically and/or physically) separated from the metal line pattern, an active region pad electrically coupled to the active region pattern and (electrically and/or physically) separated from both the metal line pattern and the well region pad, a metal line pad electrically coupled to the metal line pattern and (electrically and/or physically) separated from both the well region pad and the active region pad, and a first contact between the active region pattern and the metal line pattern to provide an electrical path therebetween.

The composite monitoring pattern according to the present invention may further comprise a second contact between the well region and the well region pad to provide an electrical path therebetween, and a third contact between the active region pattern and the active region pad to provide an electrical path therebetween.

In the composite monitoring pattern of the present invention, the active region pad may include two active region pads over different locations of the active region pattern. Furthermore, the metal line pad may include two metal line pads electrically coupled to different locations of the metal line pattern.

Additionally, in the composite monitoring pattern of this invention, the active region pattern and the metal line pattern may have elongated shapes, respectively, in a plan view. The metal line pattern may further run parallel with the active region pattern or may further meet the active region pattern at a right angle in one or more locations. Also, the active region pattern and the metal line pattern may each have a serpentine shape.

In the composite monitoring pattern of the invention, the metal line pattern, the well region pad, the active region pad, and the metal line pad may be on or in the same layer. And the well region may be formed in a scribe lane of a wafer.

DETAILED DESCRIPTION OF EXEMPLARY EMBODIMENTS OF THE INVENTION

Exemplary, non-limiting embodiments of the present invention will now be described more fully hereinafter with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

It is noted that well-known structures and processes are not described or illustrated in detail to avoid obscuring the essence of the present invention. It is also noted that the figures may not be drawn to scale. Rather, for simplicity and clarity of illustration, the dimensions of some of the elements may be exaggerated relative to other elements.

Figure 1:
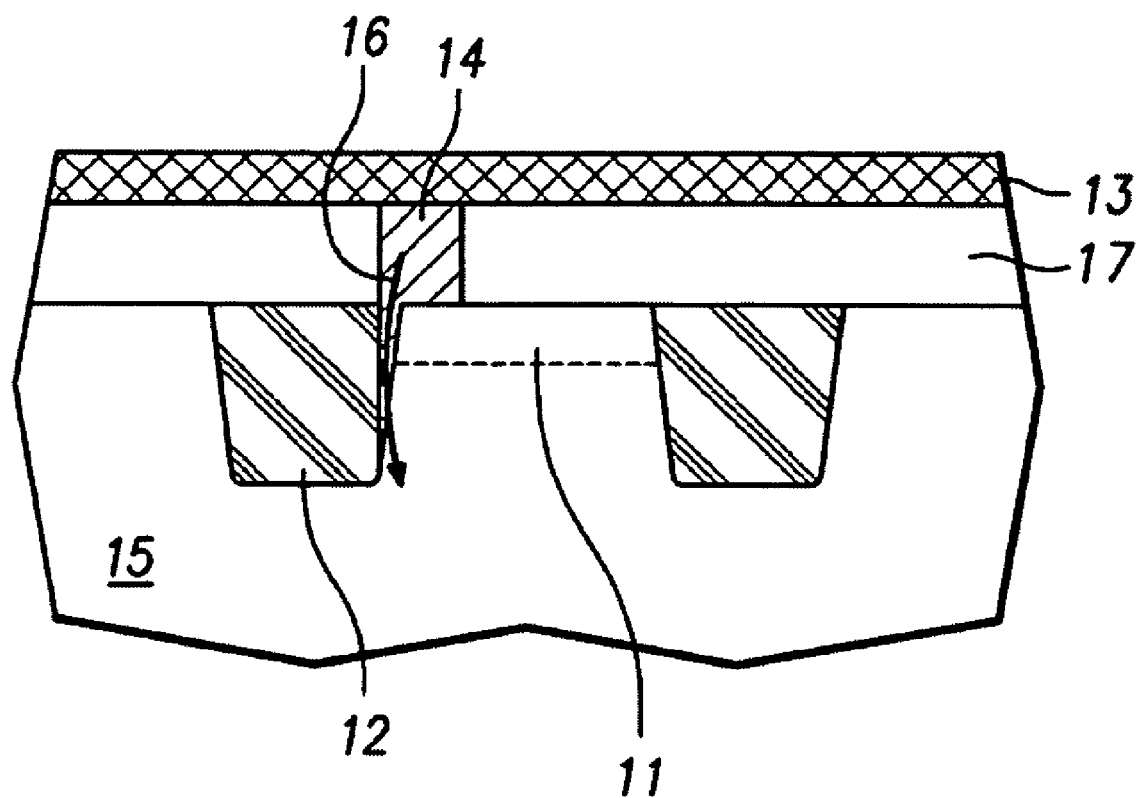
FIG. 1 is a cross-sectional view showing one example of defects typically occurring in a fabrication process of a semiconductor device.
Figure 2:
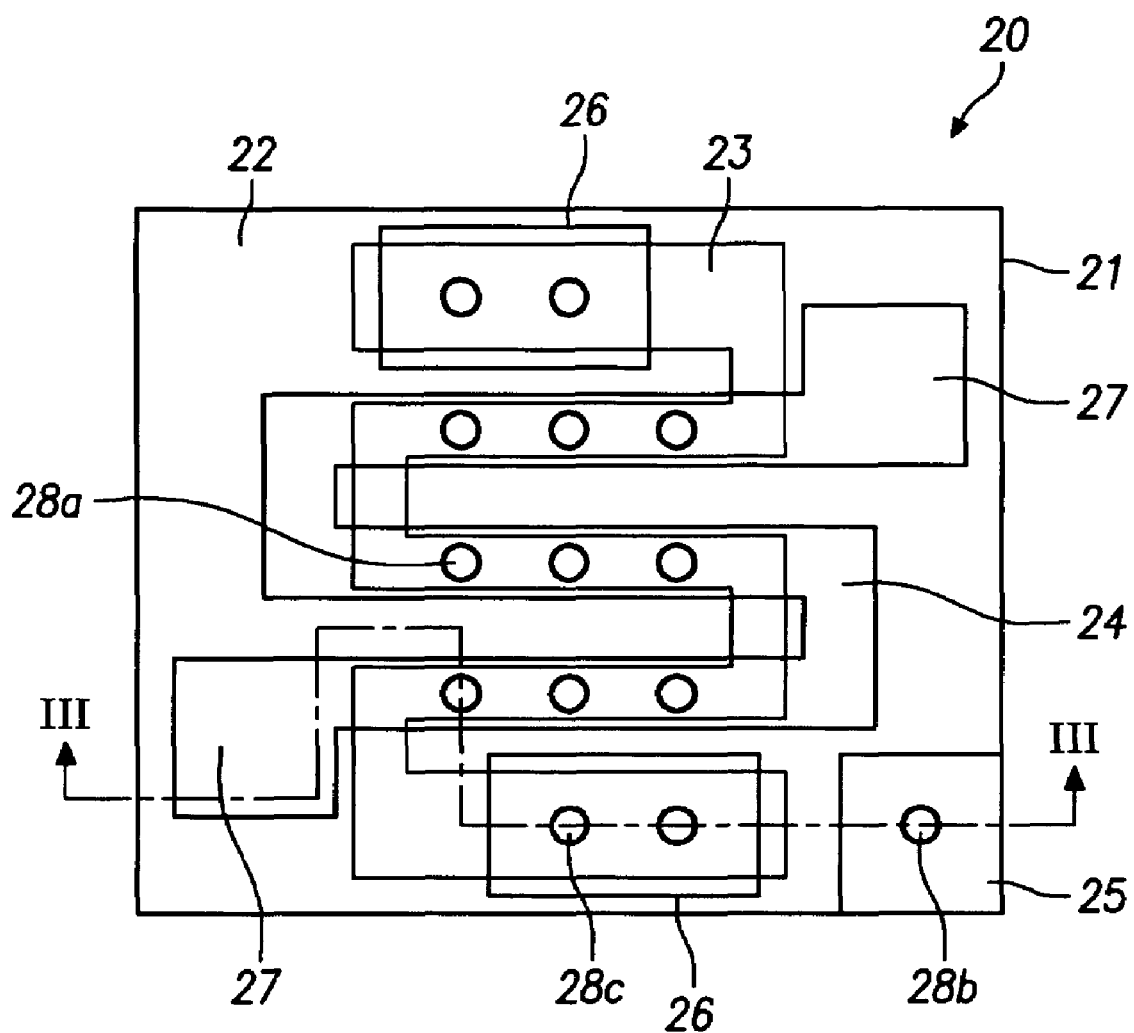
FIG. 2 is a plan view showing a composite monitoring pattern of a semiconductor device in accordance with an exemplary embodiment of the present invention.

FIG. 2 shows, in a plan view, a composite monitoring pattern 20 of a semiconductor device in accordance with an exemplary embodiment of the present invention. Further, FIG. 3 is a cross-sectional view taken along the line III-III in FIG. 2.

Figure 3:
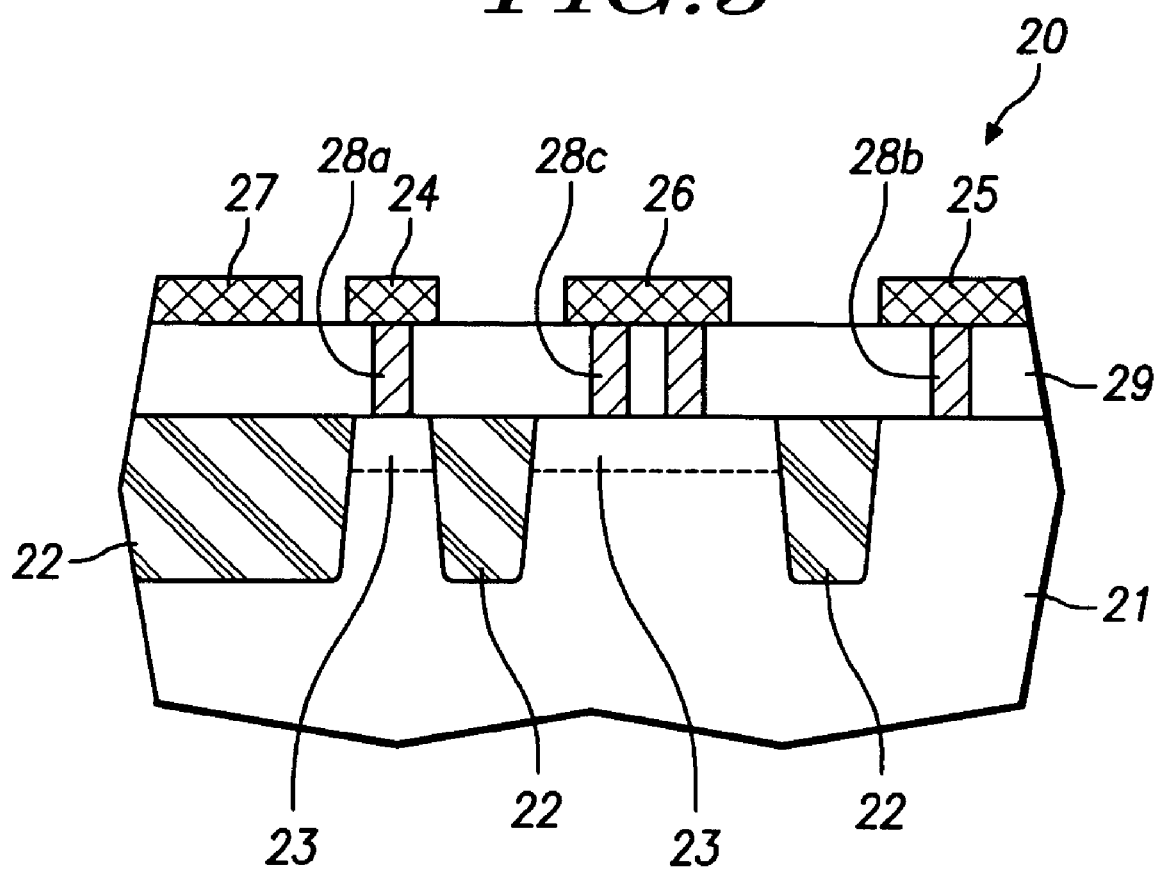
FIG. 3 is a cross-sectional view taken along the line III-III in FIG. 2.

Referring to FIGS. 2 and 3, the composite monitoring pattern 20 has a well region 21, an isolation region 22, an active region pattern 23, and a metal line pattern 24. The composite monitoring pattern 20 further has a well region pad 25, an active region pad 26, a metal line pad 27, and a plurality of contacts 28a, 28b and 28c.

The well region 21 may be preferably formed in a scribe lane of a wafer. The isolation region 22, such as shallow trench isolation (STI) layer, is selectively formed in the well region 21 (e.g., substantially in the periphery of the well region 21) to define the active region pattern 23, which is also formed in the well region 21. The metal line pattern 24 is over the well region 21, preferably on an insulating layer 29 (see FIG. 3) covering the isolation region 22 and the active region pattern 23. Particularly, the metal line pattern 24 at least partially overlies the active region pattern 23.

The well region pad 25 is over a portion of the well region 21, and is electrically coupled thereto through contact 28b. The well region pad 25 should be separated (electrically and/or physically) from the metal line pattern 24. The active region pad 26 is disposed over a portion of the active region 23, being electrically coupled thereto. The active region pad 26 should be separated (electrically and/or physically) from both the metal line pattern 24 and the well region pad 25. The metal line pad 27 may extend from the metal line pattern 24 and should be separated (electrically and/or physically) from both the well region pad 25 and the active region pad 26. The well region pad 25, the active region pad 26, and the metal line pad 27 may be preferably part of the same metallization layer as the metal line pattern 24.

The plurality of contacts may comprise a first contact 28a, a second contact 28b, and a third contact 28c. The first contact 28a is selectively formed between the active region pattern 23 and the metal line pattern 24, thus providing an electrical path between both patterns 23 and 24. Similarly, the second contact 28b is formed between the well region 21 and the well region pad 25 and provides an electrical path between them. Similarly, the third contact 28c is formed between the active region pattern 23 and the active region pad 26 and provides an electrical path between them.

The active region pad 26 may comprise two pads (a first active region pad and a second active region pad), as shown in FIG. 2. Two active region pads 26 are disposed over different locations (e.g., first and second ends) of the active region pattern 23. Similarly, the metal line pad 27 may comprise two pads (e.g., first and second metal line pads) as shown in FIG. 2. The metal line pads 27 may extend from different locations (e.g., first and second ends) of the metal line pattern 24. Alternatively, to reduce the area of the present monitor structure, the first and second metal line pads may overlie a part of the metal line pattern 24 (e.g., an end thereof) and be electrically connected to the metal line pattern 24 by a contact (not shown), similarly to contacts 28a-c in insulating layer 29 (FIG. 3).

Figure 4:
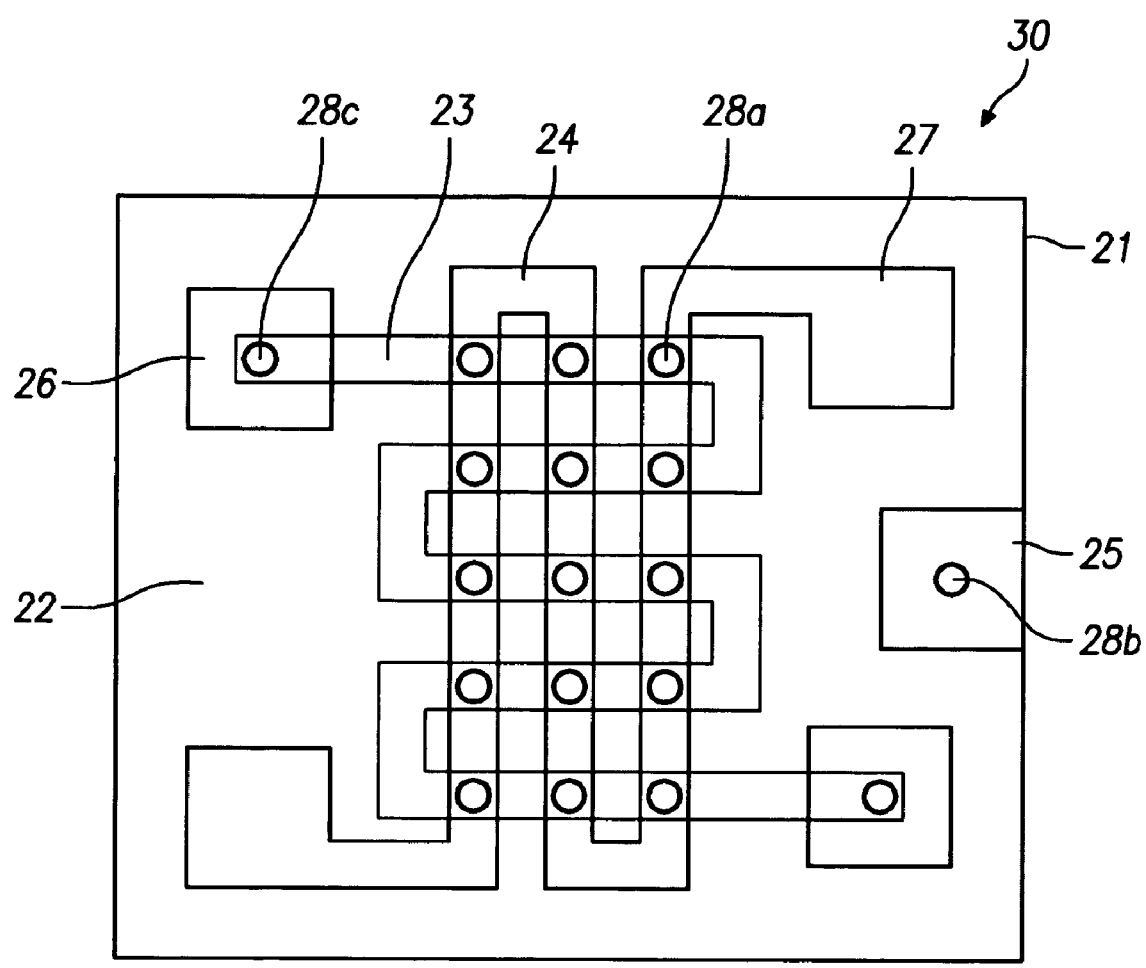
FIG. 4 is a plan view showing a composite monitoring pattern of a semiconductor device in accordance with another exemplary embodiment of the present invention.

The active region pattern 23 and the metal line pattern 24 may have elongated or serpentine shapes, as shown in FIG. 2. Also, the patterns 23 and 24 may run along a zigzag course, as depicted. In addition, the metal line pattern 24 may further run parallel with the active region pattern 23 as shown in FIG. 2. As shown in FIG. 4, in an alternative composite monitoring pattern 30, the metal line pattern 24 may further meet the active region pattern 23 at right angles. In other words, the long axis of one or more relatively long lines in the metal line pattern 24 may cross over one or more relatively long lines (or strips) in the active region pattern 23 at a right angle, and a contact 28a may be placed at one or more such crossover locations, as shown in FIG. 4.

The composite monitoring pattern 20 and/or 30 of this invention may be used as follows. To monitor metal continuity by measuring metal resistance, a given voltage is applied to the first and second metal line pads 27 through suitable probes, and a current is measured at the same pads through the same probes. Similarly, to monitor active region defects by measuring active resistance, a given voltage is applied to the first and second active region pads 26, and a current is measured at the same pads. Similarly, to monitor contact (or interconnection) defects by measuring metal-to-active area resistance, a given voltage is applied to one or more (preferably two) of the metal line pads 27 and one or more (preferably two) of the active region pads 26, and a current is measured at the same pads. Similarly, to monitor metal-to-well leakage, a given voltage is applied to one or more (preferably two) of the metal line pads 27 and the well region pad 25, and a current is measured at the same pads.

As discussed above, the composite monitoring pattern of the invention is capable of monitoring different defects, thus reducing the area of the monitor device. Furthermore, such monitoring can be implemented directly after a corresponding process is completed, thus enhancing productivity. In addition, the composite monitor can provide data for correctly analyzing causes of defects related with some processing problems. For example, if metal-to-well leakage is monitored, measuring metal resistance can tell whether the leakage is caused by metal discontinuity or not. Similarly, measuring active resistance can tell whether the leakage is caused by defects in the active area or not, and measuring metal-to-active resistance can tell whether the leakage is caused by contact defects or not. In such a method of monitoring one or more semiconductor manufacturing processes or process modules (preferably a plurality of such processes or process modules), the method may further comprise comparing the obtained or determined current to a predetermined threshold value that is correlated to the presence and/or absence of defects.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A composite monitor, comprising:
   a well region;
   an isolation region in the well region;
   an active region pattern in the well region and defined by the isolation region, the active region pattern comprising a first plurality of elongated shapes;
   a metal line pattern comprising a second plurality of elongated shapes partially overlying the active region pattern and crossing over the active region pattern;
   a well region pad electrically coupled to the well region, separate from the metal line pattern;
   an active region pad electrically coupled to the active region pattern, separate from the metal line pattern and the well region pad;
   a metal line pad extended from the metal line pattern, separate from the active region pad and the well region pad; and
   a plurality of first contacts between the active region pattern and the metal line pattern at locations where the metal line pattern crosses over the active region pattern to provide an electrical path therebetween.

2. The composite monitor of claim 1, further comprising:
   a second contact between the well region and the well region pad to provide an electrical path therebetween; and
   a third contact between the active region pattern and the active region pad to provide an electrical path therebetween.

3. The composite monitor of claim 1, wherein the active region pad includes first and second active region pads over different locations of the active region pattern.

4. The composite monitor of claim 1, wherein the metal line pad includes first and second metal line pads electrically coupled to different locations of the metal line pattern.

5. The composite monitor of claim 1, wherein one or more elongated shapes of the metal line pattern run parallel with one or more elongated shapes of the active region pattern.

6. The composite monitor of claim 1, wherein one or more elongated shapes of the metal line pattern cross over one or more elongated shapes of the active region pattern at a right angle.

7. The composite monitor of claim 1, wherein the active region pattern and the metal line pattern each have a serpentine shape.

8. The composite monitor of claim 1, wherein the metal line pattern, the well region pad, the active region pad, and the metal line pad are part of the same metal layer.

9. The composite monitor of claim 1, wherein the metal line pattern, the well region pad, and the active region pad are part of the same metal layer.

10. The composite monitor of claim 1, wherein the well region is in a scribe lane.

11. The composite monitor of claim 1, wherein the isolation region comprises a shallow trench isolation (STI) layer.

12. The composite monitor of claim 1, further comprising an insulating layer covering the isolation region and the active region pattern.

13. The composite monitor of claim 12, wherein the metal line pattern is over the well region and on the insulating layer.

14. The composite monitor of claim 4, wherein the first and second metal line pads extend from the metal line pattern, and the active region pattern is electrically connected to the metal line pattern by a plurality of contacts.

15. The composite monitor of claim 6, wherein the elongated shapes of the metal line pattern cross over the elongated shapes of the active region pattern at right angles.

16. The composite monitor of claim 1, are configured to monitor metal-to-well leakage by measuring a current at the metal line and well region pads.

17. The composite monitor of claim 3, configured to monitor active region defects by measuring active region resistance at the active region pads.

18. The composite monitor of claim 4, configured to monitor metal continuity by measuring metal resistance at the metal line pads.

19. The composite monitor of claim 1, configured to monitor contact or interconnection defects by measuring metal-to-active area resistance at the metal line pad and the active region pad.

* * * * *